United States Patent
Kim et al.

(10) Patent No.: US 6,514,810 B1
(45) Date of Patent: Feb. 4, 2003

(54) BURIED CHANNEL PMOS TRANSISTOR IN DUAL GATE CMOS WITH REDUCED MASKING STEPS

(75) Inventors: Youngmin Kim, Allen, TX (US); Amitava Chatterjee, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/920,157

(22) Filed: Aug. 1, 2001

(51) Int. Cl.[7] .......................................... H01L 21/8238
(52) U.S. Cl. ...................... 438/232; 438/224; 438/227; 438/306; 438/532
(58) Field of Search .................. 257/369; 438/223, 438/224, 199, 200, 217, 227, 201, 289, 231, 232, 275–276, 305, 306, 526, 527, 532

(56) References Cited

U.S. PATENT DOCUMENTS

| | | | | |
|---|---|---|---|---|
| 5,693,505 A | * | 12/1997 | Kobayashi | 438/217 |
| 5,702,988 A | * | 12/1997 | Liang | 438/199 |
| 5,817,551 A | * | 10/1998 | Fujii et al. | 257/29.256 |
| 5,937,287 A | * | 8/1999 | González | 438/224 |
| 6,211,003 B1 | * | 4/2001 | Taniguchi et al. | 438/224 |

* cited by examiner

Primary Examiner—Amir Zarabian
Assistant Examiner—Jamie L. Brophy
(74) Attorney, Agent, or Firm—Peter K. McLarty; W. James Brady, III; Frederick J. Telecky, Jr.

(57) ABSTRACT

A buried channel PMOS transistor for analog applications is integrated into a digital CMOS process. A third well region (105) is formed by implanting a region in the semiconductor substrate with all the n-type and p-type implants used to form the n-well and p-well regions for the digital CMOS process. A gate dielectric layer (50) and gate layer (109) are formed above the third well (105) and comprise the gate stack of the buried channel PMOS transistor. The implants used to form the drain extension regions and the source and drain regions of the CMOS transistors are used to complete the buried channel PMOS transistor.

7 Claims, 3 Drawing Sheets

BURIED CHANNEL PMOS TRANSISTOR IN DUAL GATE CMOS WITH REDUCED MASKING STEPS

FIELD OF THE INVENTION

The invention is generally related to the field of MOSFET transistors and more specifically to a novel process to form a buried channel PMOS transistor in a dual gate CMOS technology with reduced mask steps.

BACKGROUND OF THE INVENTION

As more functions become integrated on a single chip it is often necessary for analog and digital signals to be processed on the same chip. Integrated circuits that process both analog and digital signals are commonly referred to as mixed signal circuits. The MOS transistor is the building block of most integrated circuits and MOS transistors with different properties will be required to processing digital and analog signals.

Switching speed is often the most important property for a MOS transistor that processes digital signals while low noise is more important for analog signals. These differing transistor properties will require different processing conditions to produce the optimum transistor for each application. The properties of the MOS transistors depend on the gate oxide thickness, the length and width of the gate, and the doping profiles that form the various regions of the transistor. For a given gate oxide thickness, the doping profiles will be used to optimize the MOS transistor for digital or analog signal processing. The doping profiles for the various transistors are formed using ion implantation and photolithography.

Current integrated circuit manufacturing technology uses photolithography to form masks on the silicon substrate during the manufacture of the integrated circuit. These masks allow for the selective doping of the various layers used to form the integrated circuit using ion implantation. The formation of each layer of masks requires a process of depositing photoresist, exposing the photoresist to light through a photomask, and removing exposed or non exposed areas of the photoresist leaving a patterned film on the surface of the substrate. This photolithography process adds tremendous cost to the fabrication of the integrated circuit and it is therefore important that the number of photomasks that are used during the fabrication process be kept at a minimum.

SUMMARY OF THE INVENTION

The instant invention comprises a method for forming a buried channel PMOS transistor for analog applications. In particular, the method comprises forming a third well region in the semiconductor substrate by simultaneously forming a n-well region and a third well region in said semiconductor substrate by implanting n-type dopants into said substrate and forming a p-well region in said semiconductor substrate by implanting p-type dopants into said semiconductor substrate wherein said third well region is simultaneously implanted with said p-type dopants.

A dielectric layer is formed over the third well region and a gate layer is formed over the dielectric layer to form the gate stack of the buried channel PMOS transistor. The buried channel PMOS transistor is completed using the same implant processes used to form the various regions of the CMOS transistors used to process digital signals.

These and other advantages will be apparent to those of ordinary skill in the art having reference to the specification in conjunction with the drawings.

Figure 1A:
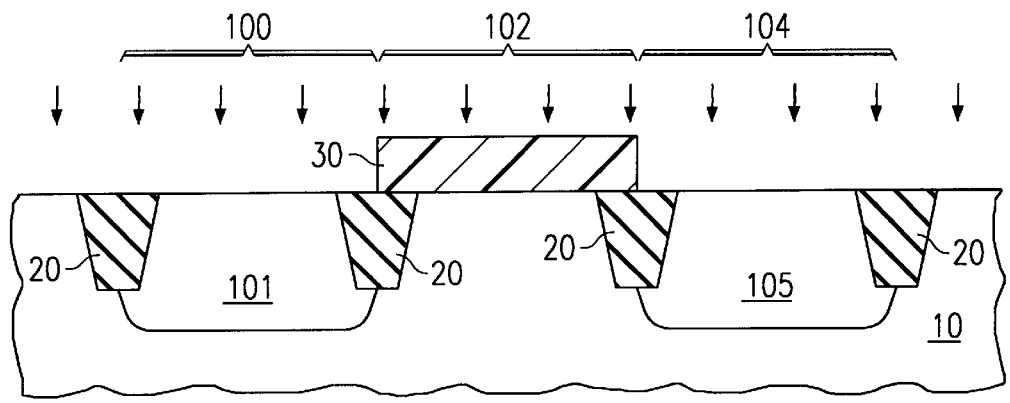
FIGS. 1(a)–1(h) are cross-sectional diagrams at various steps in the fabrication of the buried channel PMOS transistor according to an embodiment of the instant invention.

Common reference numerals are used throughout the figures to represent like or similar features. The figures are not drawn to scale and are merely provided for illustrative purposes.

DETAILED DESCRIPTION OF THE INVENTION

Figure 1B:
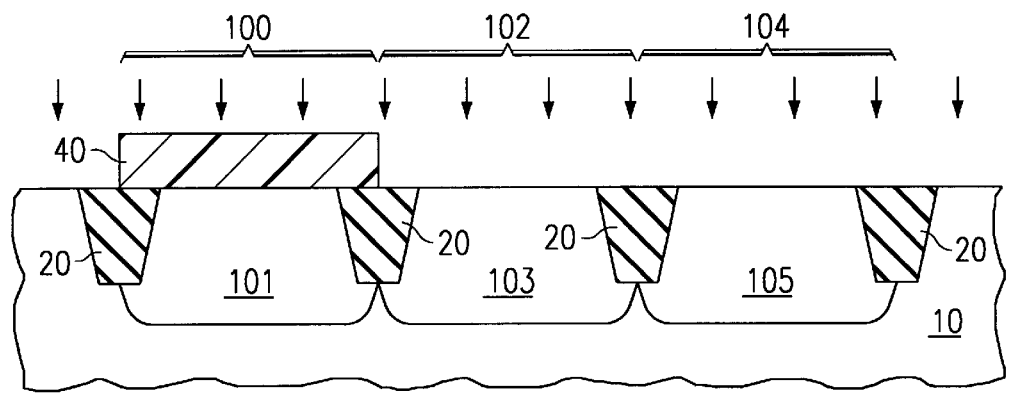
Figure 1C:
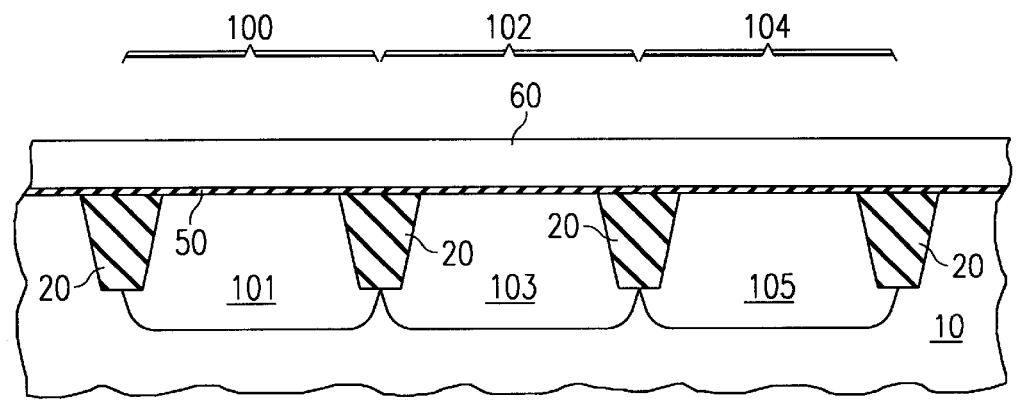
Figure 1D:
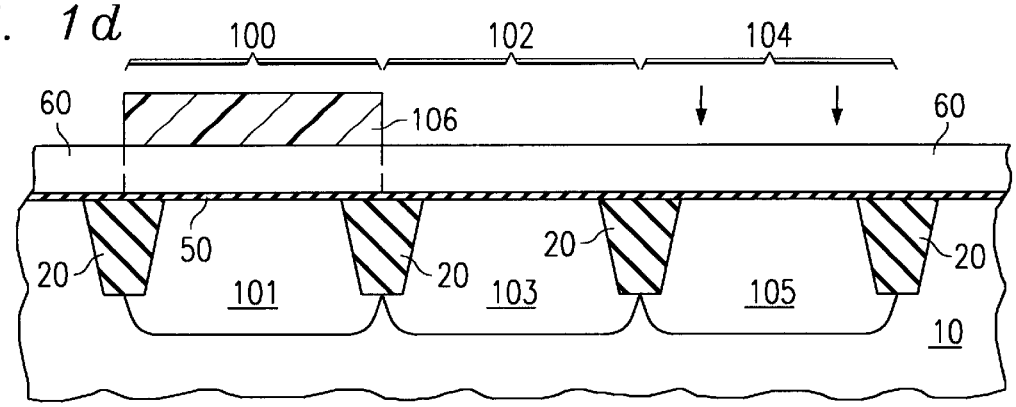
Figure 1E:
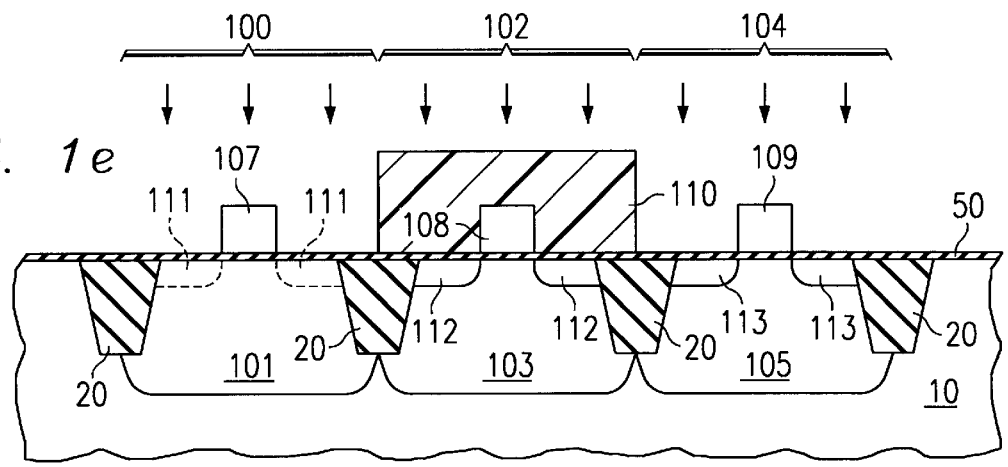
Figure 1F:
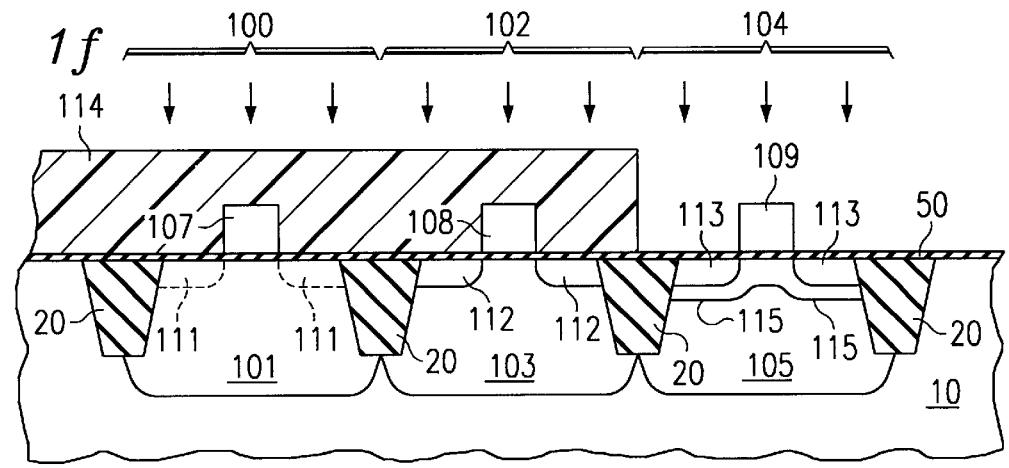
Figure 1G:
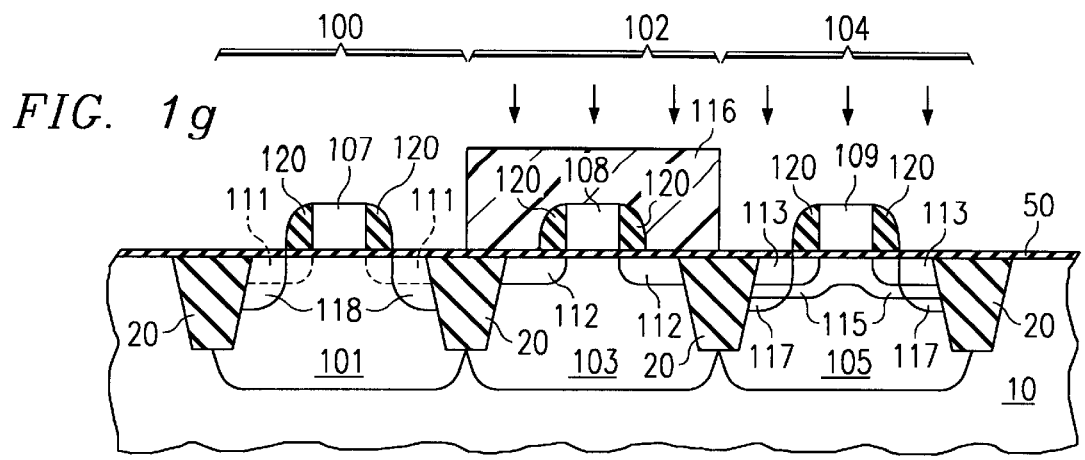
Figure 1H:
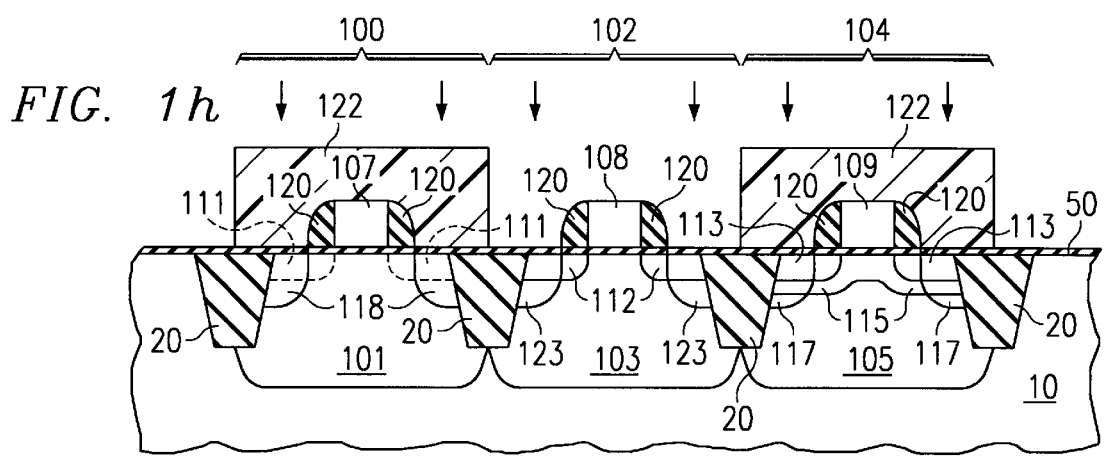
Figure 2:
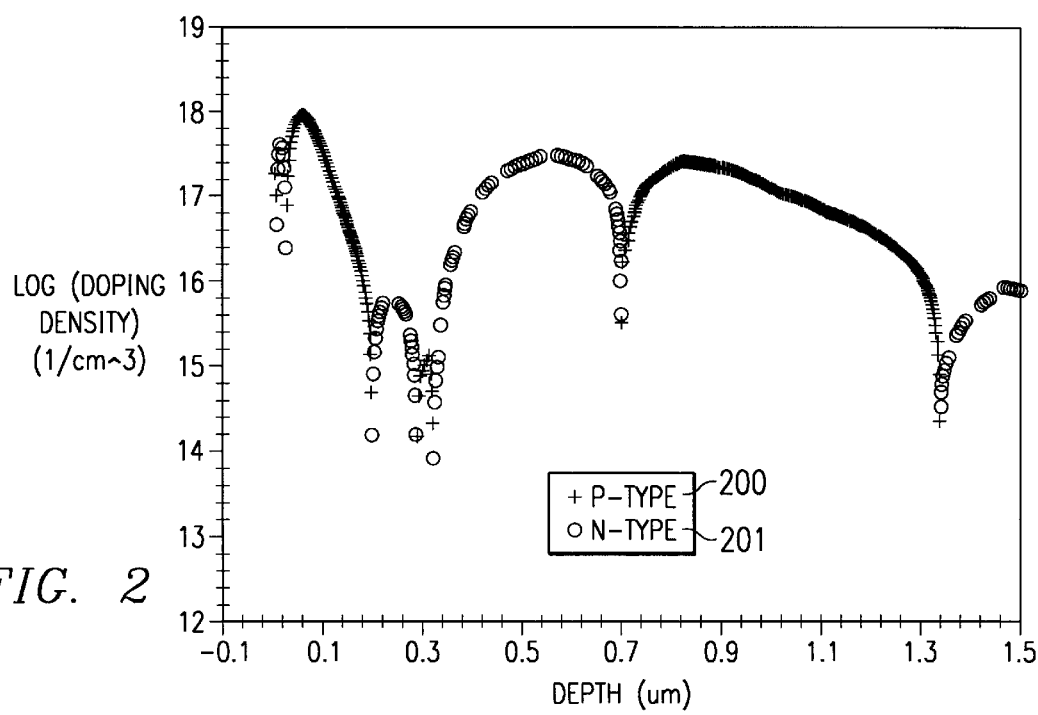
FIG. 2 shows a third well doping profile obtained from a particular embodiment of the invention.

While the following description of the instant invention revolves around FIGS. 1–2, the instant invention can be utilized in any semiconductor device structure. The methodology of the instant invention provides a solution that integrates a buried channel PMOS transistor for analog operation with MOS transistors for digital operation with no extra mask steps.

The following description of the instant invention will be related to FIGS. 1–2. Referring to FIG. 1(a) shallow trench isolation (STI) structures 20 are formed in a silicon substrate 10. The STI structures 20 are formed using a dielectric material such as silicon oxide, silicon nitride, or any suitable dielectric material. A typical process such as etching trenches in the silicon substrate, filling the trenches with the dielectric material, and removing the excess dielectric material using chemical mechanical polishing (CMP) can be used to form the STI structures. Following the formation of the STI structures 20 the well regions will be formed using ion implantation. In general complementary metal oxide semi-conductor (CMOS) integrated circuits require two types of well structures; a n-well in which PMOS transistors will be formed and a p-well in which NMOS transistors will be formed. The formation of a p-well region requires the ion implantation of p-type dopants such as boron into the silicon substrate 10. Likewise the formation of a n-well requires the ion implantation on n-type dopants such as phosphorous and/or arsenic into the substrate 10. During the ion implantation of p-type dopants into the p-well region, the n-well region is masked from the implanted species by a photomask comprising photoresist and vice versa. As illustrated in FIG. 1(a) a first photomask 30 is formed on the silicon substrate 10. The first photomask 30 comprises photoresist that has been patterned and etched using standard photolithography methods. Following the formation of the first photomask 30, multiple implants are performed simultaneously in regions 100 and 104. An n-well 101 will be formed and a third-well 105 will subsequently be formed in which the buried channel PMOS transistor will be fabricated. In an embodiment of the instant invention, the n-well 101 is formed with multiple implants comprising any combination of the following implants: a threshold voltage implant ($V_T$), a channel stop implant ($C_S$), a well implant ($W_I$), and a punch through implant ($P_T$). The threshold voltage implant is a low energy implant and dopes the near surface region of the substrate. It sets the turn-on voltage of the transistor. In an embodiment the $V_T$ implant comprises an arsenic implant at doses of $3 \times 10^{12}$ cm$^{-2}$–$7 \times 10^{12}$ cm$^{-2}$ at energies of 40 keV to 130 keV. The channel stop implant puts the peak doping concentration at the bottom of the isolation region 20. It is designed to raise the turn-on voltage of the parasitic PMOS isolation transistor so it will never turn-on during operation. In an embodiment the $C_S$ implant comprises a phosphorous implant at doses of $3\times10^{12}$ cm$^2$–$7\times10^{12}$ cm$^2$ at energies of 180 keV to 330 keV. The well implant is a high energy implant and forms a deep low resistance region in the n-well. This low resistance region keeps the voltage close to ground everywhere in the n-well and prevents transient voltages from building up that could cause latch-up to occur. In an embodiment the $W_I$ implant comprises a phosphorous implant at doses of $2\times10^{13}$ cm$^2$–$9\times10^{13}$ cm$^2$ at energies of 350 keV to 850 keV. As illustrated in FIG. 1(a), the third-well 105 will receive the same implants used to form the n-well 101.

Following the formation of the n-well 101, the first photomask 30 is removed and a second photomask 40 is formed using patterned photoresist as illustrated in FIG. 1(b). This second photomask 40 will mask the n-well 101 while the p-well 103 and the third-well 105 are being implanted as shown in FIG. 1(b). In a manner similar to that used to form the above described n-well 101, the p-well 103 is formed using multiple implants. In an embodiment of the instant invention, the p-well 103 is formed with multiple implants comprising any combination of the following implants: a threshold voltage implant ($V_T$), a channel stop implant ($C_S$), a well implant ($W_I$), and a punch through implant ($P_T$). The threshold voltage implant is a low energy implant and dopes the near surface region of the substrate. It sets the turn-on voltage of the NMOS transistor. In an embodiment the $V_T$ implant comprises an boron implant at doses of $4\times10^{12}$ cm$^2$–$1\times10^{13}$ cm$^2$ at energies of 5 keV to 30 keV. The channel stop implant puts the peak doping concentration at the bottom of the isolation region 20. It is designed to raise the turn-on voltage of the parasitic NMOS isolation transistor so it will never turn-on during operation. In an embodiment the $C_S$ implant comprises a boron implant at doses of $3\times10^{12}$ cm$^2$–$1\times10^{13}$ cm$^2$ at energies of 80 keV to 180 keV. The well implant is a high energy implant and forms a deep low resistance region in the n-well. This low resistance region keeps the voltage close to ground everywhere in the n-well and prevents transient voltages from building up that could cause latch-up to occur. In an embodiment the $W_I$ implant comprises a boron implant at doses of $1\times10^{13}$ cm$^2$–$9\times10^{13}$ cm$^2$ at energies of 250 keV to 400 keV. As illustrated in FIG. 1(b), the third-well 105 will receive the same implants used to form the p-well 103. The third-well 105 is therefore formed simultaneously with the n-well 101 and the p-well 103 using the same implants that are used to form both the n-well and the p-well.

Shown in FIG. 2 is a third well doping profile obtained form an embodiment of the instant invention. The compensation of the various n-type dopants and p-type dopants in the third well region will produce a near surface p-type region 200 and a deeper n-type region 201. If the isolation structures 20 shown in FIG. 1(b) are less than 0.7 mm deep then no additional implants will be required for the embodiment shown in FIG. 2. For this embodiment if the isolation structures 20 are deeper than 0.7 mm then additional n-type implants will be required to extend the depth of the deeper n-type region 201 to beneath the depth of the isolation structures 20.

Following the formation of the various wells 101, 103, and 105, a gate dielectric layer 50 is formed on the surface of the silicon substrate 10 as shown in FIG. 1(c). The gate dielectric 50 may be comprised of an oxide, thermally grown SiO2, a nitride, an oxynitride, or any combination thereof, and is preferably on the order of 1 to 10 nm thick. To form the gate layer 60, a layer of silicon containing material is subsequently formed on the gate dielectric 50 also shown in FIG. 1(c). Preferably this silicon-containing material is comprised of polycrystalline silicon("poly" or "polysilicon"), but it may be comprised of epitaxial silicon or any other semiconducting material.

To adjust the threshold voltage for proper transistor operation the polysilicon regions that will form the gate electrode for the NMOS transistor is doped with an n-type dopant by ion implantation. As shown in FIG. 1(d) a patterned photoresist layer 106 is formed to mask the PMOS transistor region during the ion implantation of n-type dopants. In an embodiment of the instant invention the polysilicon region that will form the gate electrode for the buried channel PMOS transistor is opened during the n-type ion implantation process and is doped simultaneously with the other polysilicon regions for the NMOS transistors. This is often required to adjust the threshold voltage of the buried channel PMOS transistor. In other embodiments however the buried channel PMOS transistor will not receive this n-type polysilicon implant.

Following the selective doping of the polysilicon layer 60, the polysilicon is etched using standard processes to form the gate electrodes and define the various transistors. A NMOS gate electrode 108, a PMOS gate electrode 107, and a gate electrode for a buried channel PMOS transistor 109 are shown in FIG. 1(e). Following the formation of the gate electrode regions 107, 108, and 109, the drain extension (LDD) implants are performed. A patterned photoresist film is formed and the NMOS transistor area 100 is exposed. n-type dopants such as phosphorous and/or arsenic are then implanted in regions adjacent to the gate structure 108. The doped LDD regions 112 for the NMOS transistor are shown in FIG. 1(e). In addition to the drain extension implants pocket implants can also be performed if required. Following the formation of the NMOS drain extensions 112, a patterned photoresist layer 110 is formed to mask the NMOS transistor during the PMOS transistor drain extension and, if required, PMOS transistor pocket implants. For the PMOS transistor 100 and buried channel PMOS transistor 104, p-type dopant species such as boron will be implanted. The PMOS transistor 100 and the buried channel PMOS transistor 104 will be implanted simultaneously to form the PMOS transistor drain extension region 111 and the buried channel PMOS transistor drain extension region 113.

In addition to the PMOS and NMOS transistors associated with the digital logic circuits, most integrated circuits have output MOS transistors which are used to transfer the signals generated in the integrated circuit to outside leads. The output MOS transistors have different properties compared to the core transistors and often have different physical dimensions and ion implantation conditions. In some instances it may be necessary to expose the buried channel PMOS transistor to the implants used to form the output transistors. As shown in FIG. 1(f) a patterned photoresist layer 114 is used to mask the NMOS transistor 102 and the PMOS transistor 100 from the output transistor implant. The output transistor is not shown in FIG. 1(f) for clarity. The implant will result in the doped region 115 being formed. For the buried channel transistor 104 the implanted species will be p-type. This implant is often called a through-gate implant because the species will penetrate the gate stack and form the doped region 115 in the substrate 10 beneath the gate. This through gate implant, if required, will adjust the threshold voltage of the buried channel PMOS transistor.

Following the formation of the doped region 115 in the buried channel PMOS transistor, the sidewall structures 120 are formed as illustrated in FIG. 1(g). The sidewall structures 120 may comprise silicon oxide, silicon nitride, or any suitable dielectric material. The sidewall structures 120 are formed using standard process techniques such as a blanket film deposition followed by an anisotropic etching process. As shown in FIG. 1(g) the PMOS transistor source drain regions 118 and the buried channel PMOS transistor source drain regions 117 are simultaneously formed by ion implanting p-type dopants while a patterned photoresist layer 116 masks the NMOS transistor 102. The NMOS transistor source and drain regions 123 are formed by ion implanting n-type dopants while the PMOS transistor and the buried channel PMOS transistor are masked with a patterned photoresist layer 122 as illustrated in FIG. 1(h).

While this invention has been described with reference to illustrative embodiments, this description is not intended to be construed in a limiting sense. Various modifications and combinations of the illustrative embodiments, as well as other embodiments of the invention will be apparent to persons skilled in the art upon reference to the description. It is therefore intended that the appended claims encompass any such modifications or embodiments.

We claim:

1. A method for forming a buried channel PMOS transistor in an integrated circuit, comprising:

providing a semiconductor substrate;

simultaneously forming a n-well region and a third well region in said semiconductor substrate by implanting first n-type dopants into said substrate;

forming a p-well region in said semiconductor substrate by implanting first p-type dopants into said semiconductor substrate wherein said third well region is simultaneously implanted with said first p-type dopants;

forming a dielectric layer over said semiconductor substrate;

forming a gate layer over said dielectric layer;

implanting said gate layer with second n-type dopants such that a first region of said gate layer over said p-well region and a second region of said gate layer over said third well region are both doped n-type, forming a gate electrode over said third well region by etching said gate layer; and implanting said gate electrode and said third well region with second p-type dopants wherein an output MOS transistor is simultaneously implanted with said second p-type dopants.

2. The method of claim 1 wherein said implanting of said second p-type dopants forms a p-type region beneath said gate electrode in said third well region.

3. The method of claim 1 wherein said dielectric layer is a material selected from the group consisting of silicon oxide, silicon nitride, and silicon oxynitride.

4. A method for forming a buried channel PMOS transistor in an integrated circuit, comprising:

providing a semiconductor substrate;

simultaneously forming a n-well region and a third well region in said semiconductor substrate by implanting first n-type dopants into said substrate;

forming a p-well region in said semiconductor substrate by implanting first p-type dopants into said semiconductor substrate wherein said third well region is simultaneously implanted with said first p-type dopants;

forming a dielectric layer over said semiconductor substrate;

forming a gate layer over said dielectric layer;

implanting said gate layer with second n-type dopants such that a first region of said gate layer over said p-well region and a second region of said gate layer over said third well region are both doped n-type, forming a gate electrode over said third well region by etching said gate layer;

implanting said gate electrode and said third well region with second p-type dopants wherein an output MOS transistor is simultaneously implanted with said second p-type dopants;

forming sidewall structures adjacent said gate electrode; and forming a source region and a drain region in said semiconductor substrate adjacent to said sidewall structures.

5. The method of claim 4 wherein said implanting of said second p-type dopants forms a p-type region beneath said gate electrode in said third well region.

6. The method of claim 4 wherein said dielectric layer is a material selected from the group consisting of silicon oxide, silicon nitride, and silicon oxynitride.

7. The method of claim 4 wherein said sidewall structures comprise a material selected from the group consisting of silicon oxide, silicon nitride, and silicon oxynitride.

* * * * *